US012638516B2

(12) United States Patent
Werelius

(10) Patent No.: US 12,638,516 B2
(45) Date of Patent: May 26, 2026

(54) METHOD AND DEVICE FOR MEASURING HIGH VOLTAGE DEVICES USING A CORRECTION FACTOR

(71) Applicant: MEGGER SWEDEN AB, Danderyd (SE)

(72) Inventor: Peter Werelius, Solna (SE)

(73) Assignee: MEGGER SWEDEN AB, Danderyd (SE)

( * ) Notice: Subject to any disclaimer, the term of this patent is extended or adjusted under 35 U.S.C. 154(b) by 185 days.

(21) Appl. No.: 18/723,499

(22) PCT Filed: Dec. 29, 2022

(86) PCT No.: PCT/SE2022/051250
§ 371 (c)(1),
(2) Date: Jun. 24, 2024

(87) PCT Pub. No.: WO2023/128858
PCT Pub. Date: Jul. 6, 2023

(65) Prior Publication Data
US 2025/0044374 A1 Feb. 6, 2025

(30) Foreign Application Priority Data
Dec. 30, 2021 (SE) .................................... 2151637-2

(51) Int. Cl.
*G01R 31/62* (2020.01)
*G01R 21/00* (2006.01)
(Continued)

(52) U.S. Cl.
CPC ......... *G01R 31/62* (2020.01); *G01R 27/2605* (2013.01); *G01R 27/2611* (2013.01); *G01R 31/3274* (2013.01); *G01R 31/34* (2013.01)

(58) Field of Classification Search
CPC ........ G01R 31/00; G01R 31/12; G01R 31/32; G01R 31/327; G01R 31/34; G01R 31/62;
(Continued)

(56) References Cited

U.S. PATENT DOCUMENTS

| | | | | |
|---|---|---|---|---|
| 10,203,364 | B2 * | 2/2019 | Lachman | G01R 31/62 |
| 2010/0106435 | A1 | 4/2010 | Werelius et al. | |

FOREIGN PATENT DOCUMENTS

| | | |
|---|---|---|
| EP | 0990916 A1 | 4/2000 |
| RU | 2330297 C1 | 7/2008 |
| WO | 2014170306 A1 | 10/2014 |

OTHER PUBLICATIONS

International Search Report/Written Opinion dated Mar. 3, 2023 in related/corresponding PCT Application No. PCT/SE2022/051250.

* cited by examiner

*Primary Examiner* — Neel D Shah
(74) *Attorney, Agent, or Firm* — PATENT PORTFOLIO BUILDERS PLLC

(57) ABSTRACT

A method of measuring a characteristic of an electrical insulation system of a high voltage device connectable to an electrical network, the method comprising the following steps: disconnecting the high voltage device from the electrical network and connecting a measuring equipment to the electrical insulation system, thereby providing a test system, connecting an inductor to the test system, determining a reference frequency, determining a measuring frequency of the measuring operation, measuring at least one of capacitance and loss at the measuring frequency and at the reference frequency, providing at least one correction factor according to formulas, and applying the at least one correction factor on measurement results at the measuring fre-
(Continued)

100 Disconnect high voltage device
110 Connect an inductor
120 Determine reference frequency
130 Determine insulation temperature
140 Determine equivalent frequency
150 Determine measuring frequency
160 Measure capacitance and/or loss
170 Provide correction factor(s)
180 Obtain corrected measurements quency to obtain corrected measurements results corresponding to the reference frequency. A device using the method is also provided.

12 Claims, 3 Drawing Sheets

(51) Int. Cl.
| | |
|---|---|
| *G01R 27/02* | (2006.01) |
| *G01R 27/04* | (2006.01) |
| *G01R 27/26* | (2006.01) |
| *G01R 31/00* | (2006.01) |
| *G01R 31/12* | (2020.01) |
| *G01R 31/327* | (2006.01) |
| *G01R 31/34* | (2020.01) |

(58) Field of Classification Search
CPC ........ G01R 27/02; G01R 27/04; G01R 27/22;
G01R 27/26; G01R 21/00
See application file for complete search history.

100 Disconnect high voltage device

110 Connect an inductor

120 Determine reference frequency

130 Determine insulation temperature

140 Determine equivalent frequency

150 Determine measuring frequency

160 Measure capacitance and/or loss

170 Provide correction factor(s)

180 Obtain corrected measurements

METHOD AND DEVICE FOR MEASURING HIGH VOLTAGE DEVICES USING A CORRECTION FACTOR

TECHNICAL FIELD

The present invention relates generally to measuring of high voltage devices and more specifically to a method and a device for measuring a characteristic of an electrical insulation system of a high voltage device connectable to an electrical network, in which a correction factor is used.

BACKGROUND ART

Different kinds of diagnostic measuring methods are used to determine or estimate the state or condition of test object, such as an electrical insulation system. By "state" is meant a state which, if deteriorated, indicates that a replacement of or an attending to at least part of the test object is required. For example, they may be a need to dry the test object.

A common method is to measure the capacitance and the loss at mains frequency, usually 50 Hz or 60 Hz. The loss can be expressed in different ways, such as Loss C", Dissipation factor, Tan-delta or Insulation Power Factor. Based on experience and previous measurements, the state of the electrical insulation system is determined.

In case high capacitance is to be measured at a high voltage, such as the electrical insulation system of rotating machines, a resonance system is commonly used wherein an inductor is connected in parallel and/or in series to the electrical insulation system to create a resonance circuit. By means of this resonance circuit, the current and/or voltage needed for the measuring operation is considerably lowered, which puts lowered demands of the current generation capacity of the measuring system.

Since the capacitance of the test object varies between different test objects, the resonance circuit must be adjustable for different capacitances, i.e., for different test objects. Basically, this can be done in two different ways: either you use a variable inductor to be able to set the inductance to create an appropriate resonance frequency, such as 50 Hz, or you use one or more fixed inductors and adjust the frequency to obtain resonance.

A variable inductor is heavy, often weighting more than 100 kilograms. An advantage of using one or more fixed inductors is therefore a simpler system, which results in a lighter and less expensive system. The drawback is that measuring of similar test objects will be performed at slightly different frequencies, which changes the results and makes the evaluation more difficult.

In order to successfully determine the state of the test object based on previous measurements, methods are needed to correct the measuring results with regard to characteristics which change the measuring result but do not change the state of the test object. One such characteristic is the temperature of the test object which considerably changes the capacitance and the loss without permanently changing the state of the test object. One other such characteristic is the test frequency which also considerably changes the capacitance and the loss without permanently changing the state of the test object.

Traditionally, tables have been used to correct for the effect of temperature changes. However, the use of such tables has been proved to be deficient, so a method based on measurements at one or more frequencies above and/or below the system frequency to be analyzed, such as 50 Hz or 60 Hz, is used instead in order to make a temperature correction. One example of this is disclosed in the international patent publication No. WO2014/170306 A1.

Traditionally, no correction has been applied to correct for the effect of frequency. In cases where effect of frequency is important, the test frequency is usually specified within a short frequency range.

It can be complicated to perform measurements at different frequencies on a test object where a resonance system is required. However, since the voltage level used to determine the temperature correction and/or frequency correction may be very low, no resonance system is required. Often the resonance system may remain connected to simplify the operation.

SUMMARY OF INVENTION

An object of the present invention is to provide a simplified method of measuring a characteristic of an electrical insulation system of a high voltage device.

According to a first aspect of the invention, a method of measuring a characteristic of an electrical insulation system of a high voltage device connectable to an electrical network is provided comprising the following steps: disconnecting the high voltage device from the electrical network and connecting a measuring equipment to the electrical insulation system, thereby providing a test system, connecting an inductor (30) to the test system, determining a reference frequency, determining a measuring frequency of the measuring operation, measuring at least one of capacitance and loss at the measuring frequency and at the reference frequency, providing at least one correction factor according to the following formulas:

$$C\_corr\_F = C\_r/C\_m$$

$$Loss\_corr\_F = Loss\_r/Loss\_m$$

and applying the at least one correction factor on measurement results at the measuring frequency to obtain corrected measurements results corresponding to the reference frequency.

According to a first aspect of the invention, a method of measuring a characteristic of an electrical insulation system of a high voltage device connectable to an electrical network is provided comprising the following steps: disconnecting the high voltage device from the electrical network and connecting a measuring equipment to the electrical insulation system, thereby providing a test system, connecting an inductor to the test system, determining a reference frequency, determining an insulation temperature of the electrical insulation system, determining an equivalent frequency based on the insulation temperature, a reference temperature, a reference frequency, and the activation energy of the electrical insulation system, determining a measuring frequency of the measuring operation, measuring at least one of capacitance and loss at the measuring frequency and at the equivalent frequency, providing at least one correction factor according to the following formulas:

$$C\_corr\_C = C\_e/C\_m$$

$$Loss\_corr\_C = Loss\_e/Loss\_m$$

and applying the at least one correction factor on measurement results at the measuring frequency to obtain corrected measurements results corresponding to the reference frequency and at the reference temperature.

In a preferred embodiment, the high voltage device is any of the following: electric transformer, including power transformers, instrument transformer, cable, bushing, generator, and other rotating machine, and circuit breaker.

In a preferred embodiment, the reference frequency is any of the following: 0.1 Hz, 1 Hz, 16.67 Hz, 25 Hz, 50 Hz and 60 Hz.

the step of determining the measuring frequency comprises the following steps: determining the capacitance of the test system, determining possible inductances connectable to the test system, based on the capacitance of the test system and possible inductances, determining the measuring frequency at or close to resonance.

In a preferred embodiment, the characteristic is any of the following: capacitance and loss.

In a preferred embodiment, wherein the characteristic is capacitance, the capacitance of the insulation system is preferably above 50 nF, more preferably above 80 nF and most preferably above 100 nF.

In a preferred embodiment, the inductor is connected in parallel with the high voltage device. This provides for a low measuring current, reducing the required measuring power. Alternatively, the inductor is connected in series with the high voltage device. This provides for a low measuring voltage, reducing the required measuring power.

In a preferred embodiment, the reference temperature is selected to be 20° C., which is a reference temperature which is commonly used for measuring insulations.

In a preferred embodiment, the method comprises the additional step of replacing or attending to at least part of the electrical insulation system if the measured characteristic indicates that the electrical insulation system is faulty.

In a preferred embodiment, at equivalent frequency and/or reference frequency, the applied voltage level is lowered a factor of least 5, preferably of at least 10, compared to voltage level used at measurement frequency.

According to a third aspect of the invention, a device for measuring a characteristic of an electrical insulation system of a high voltage device connectable to an electrical network is provided, the device comprising a test equipment provided with processing means adapted to perform the above described methods.

BRIEF DESCRIPTION OF DRAWINGS

The invention is now described, by way of example, with reference to the accompanying drawings, in which.

DESCRIPTION OF EMBODIMENTS

In the following, a detailed description of a method of measuring a characteristic of an electrical insulation system of a high voltage device, such as capacitance and/or loss, will be given. With the term "high voltage device" should be interpreted as any device, such as electric transformer, including power transformers, instrument transformers, cables, bushings, generators, and other rotating machines, circuit breakers, and others adapted for operation at high voltages, such as above 600 V.

Figure 1:
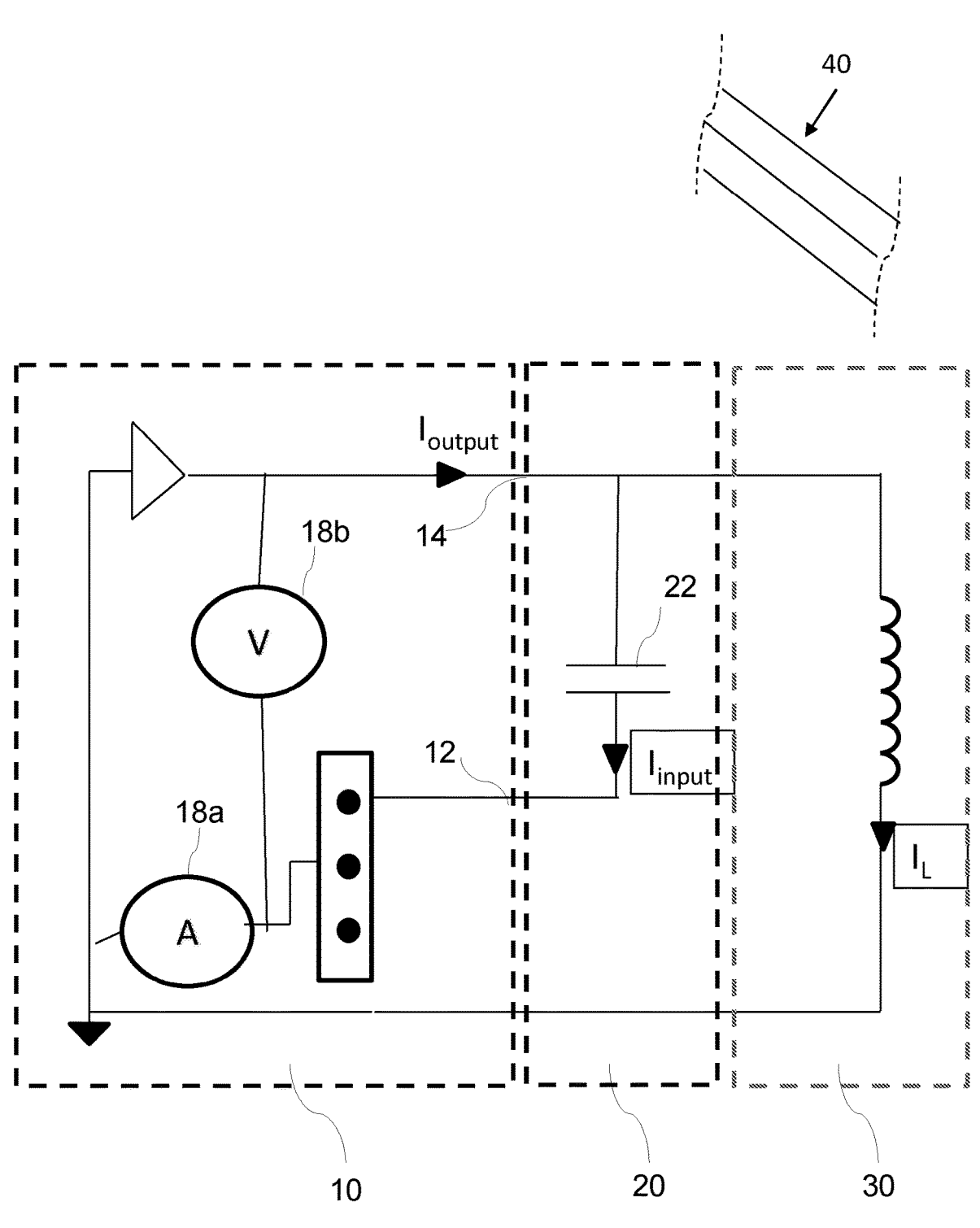
FIG. 1 is an overall view of a test system used in the method according to the invention.
Figure 2:
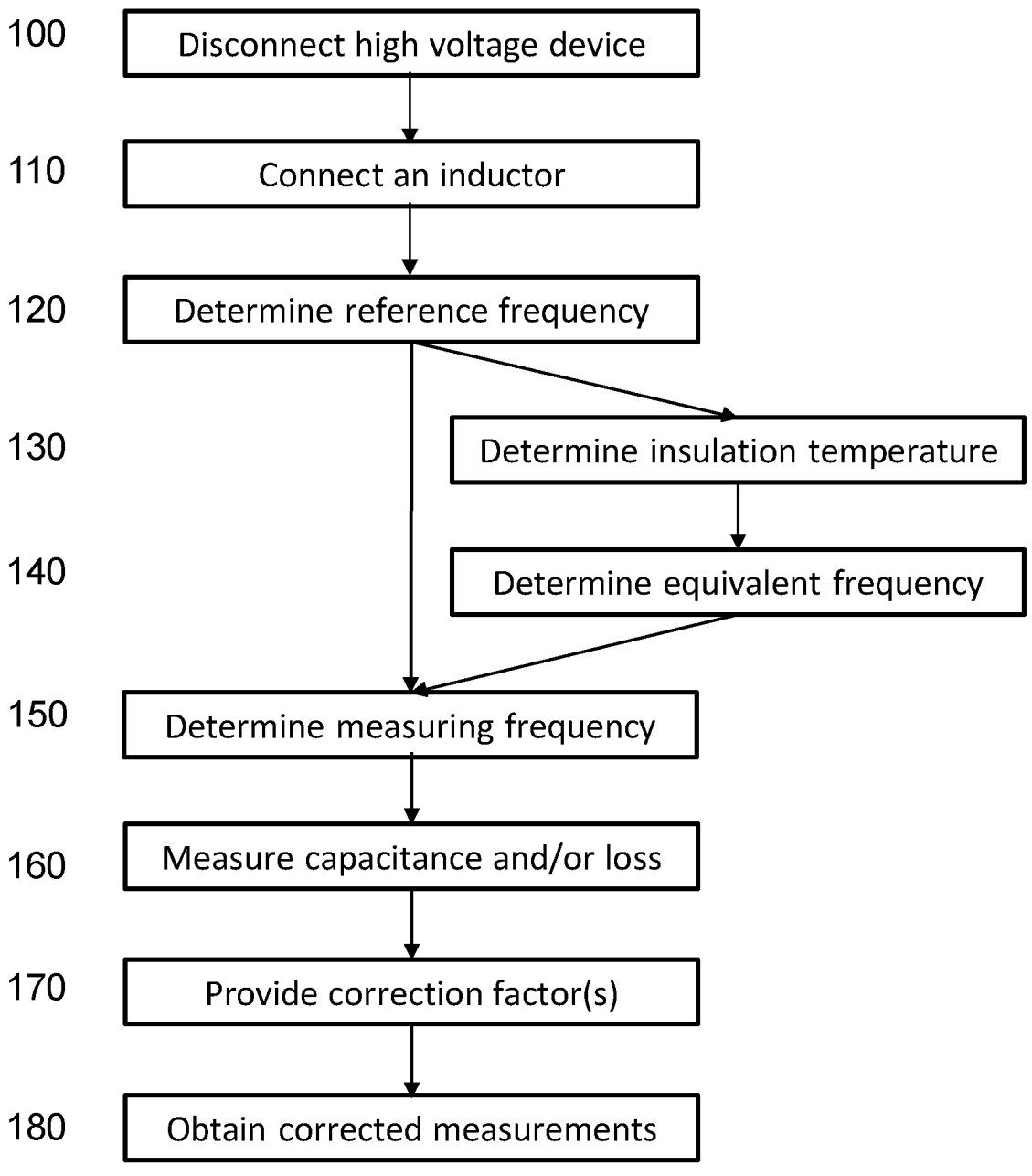
FIG. 2 is a flow diagram showing the steps of the method according to the invention.

With reference to FIG. 1, a test device 10 is shown. This test device may be an insulation diagnostic instrument capable of measuring capacitance and loss at variable frequencies, for example a DFR (Dielectric Frequency Response) or narrow band DFR, for example. As a first step 100 in the testing process, see FIG. 2, a high voltage device 20 to be tested is disconnected from any electrical network, shown schematically as 40 in the figure, to which it is connected. This is a necessary step for obtaining correct measurements and connecting a measuring equipment to the electrical insulation system, schematically shown as a capacitance 22, thereby providing a test system. The test device 10 is connectable to the high voltage device 20 by means of terminals 12, 14. The test device 10 also comprises processing and evaluation means, generally shown as an Ampere/Volt meter 18 a, 18b. An inductor 30, preferably a fixed inductor, is connected in step 110 to the high voltage device 20, in the shown embodiment in parallel to the high voltage device 30. The inductor may as an alternative be connected in series with the high voltage device 20.

As another step 120, a reference frequency of the measuring operation is determined. The reference frequency is usually selected based on where reference data is available, e.g., main frequency 50/60 Hz, but may be another frequency where reference data is available, such as 0.1 Hz, 1 Hz, 16.67 Hz, and 25 Hz. The frequency may also be selected for another reason, such as creating reference data or special interest of the insulation system performance at a certain frequency.

Then, depending on if frequency correction (A in FIG. 3), temperature correction (B in FIG. 3) or combined frequency and temperature correction (C in FIG. 3) different paths are chosen. If frequency correction only is used, step 130 and 140, see FIG. 2, can be omitted.

Then, the insulation temperature of the electrical insulation system of the high voltage device is determined in step 130. The insulation temperature can be determined in any conventional way, such as estimate based on temperature measurements of e.g., insulation liquid, ambient temperature, and surfaces, or estimate insulation temperature based on winding resistance. Also record of previous loading and available temperature gauges/sensors may be used.

An equivalent frequency is then determined in step 140 based on the measured insulation temperature, a reference temperature, a reference frequency (determined in step 120), and the activation energy of the electrical insulation system. The activation energy of the electrical insulation system can usually be estimated well enough by knowing the insulation material groups of the insulation system. Typically, the activation energy only varies in a relatively small range from about 0.4 to 1.2 eV. The reference temperature is often selected to be 20° C. but may be selected to another temperature.

As another step 150, the measuring frequency of the measuring operation is determined. The measuring frequency is usually selected based on where reference data is available, e.g., main frequency 50/60 Hz, but may be another frequency where reference data is available, such as 0.1 Hz, 1 Hz, 16.67 Hz, and 25 Hz. The frequency may also be selected for another reason, such as creating reference data or special interest of the insulation system performance at a certain frequency. In a preferred embodiment, the measuring frequency is determined in the following way. The capacitance of the test system and possible inductances connectable to the test system are determined. Based on the capacitance of the test system and possible inductances, the measuring frequency at or close to resonance is determined.

By means of the test device 10, at least one of capacitance and loss at the measuring frequency (C_m, Loss_m) and if correction of temperature effect is included at the equivalent frequency (C_e, Loss_e), and if only correction of frequency effect is included at the reference frequency (C_r, Loss_r=, is measured in step 160. In order to allow measurements at equivalent frequency and/or reference frequency, the applied voltage level is lowered typically a factor of least 5, preferably at least 10, compared to voltage level used at measurement frequency. This will in turn reduce the output current required. In other words, the following parameters may be measured if capacitance is measured:

the capacitance C_m at the measuring frequency,
the capacitance C_e at the equivalent frequency, and
the capacitance C_r at the reference frequency The following parameters may be measured if loss is measured:

the loss Loss_m at the measuring frequency,
the loss Loss_e at the equivalent frequency and
the loss Loss_r at the reference frequency If capacitance is determined, the capacitance of the insulation system is preferably above 50 nF, more preferably above 80 nF and most preferably above 100 nF.

One or both of two frequency correction factors C_corr_F and Loss_corr_F are then provided or calculated in step 170 according to the following formulas:

$$C\_corr\_F = C\_r/C\_m$$

$$Loss\_corr\_F = Loss\_r/Loss\_m$$

One or both of two temperature correction factors C_corr_T and Loss_corr_T are then provided or calculated in step 170 according to the following formulas:

$$C\_corr\_T = C\_e/C\_r$$

$$Loss\_corr\_T = Loss\_e/Loss\_r$$

One or both of two combined correction factors C_corr_C and Loss_corr_C are then provided or calculated in step 170 according to the following formulas:

$$C\_corr\_C = C\_e/C\_m$$

$$Loss\_corr\_C = Loss\_e/Loss\_m$$

The correction factor is then in step 180 applied on measurement results at the measuring frequency to obtain corrected measurements results of the characteristics to be determined, such as capacitance and/or loss, corresponding to the reference frequency and if combined correction factor is used at the reference temperature.

If the measured characteristic indicates that the electrical insulation system is faulty, at least part of the electrical insulation system may be replaced or attended to.

Figure 3:
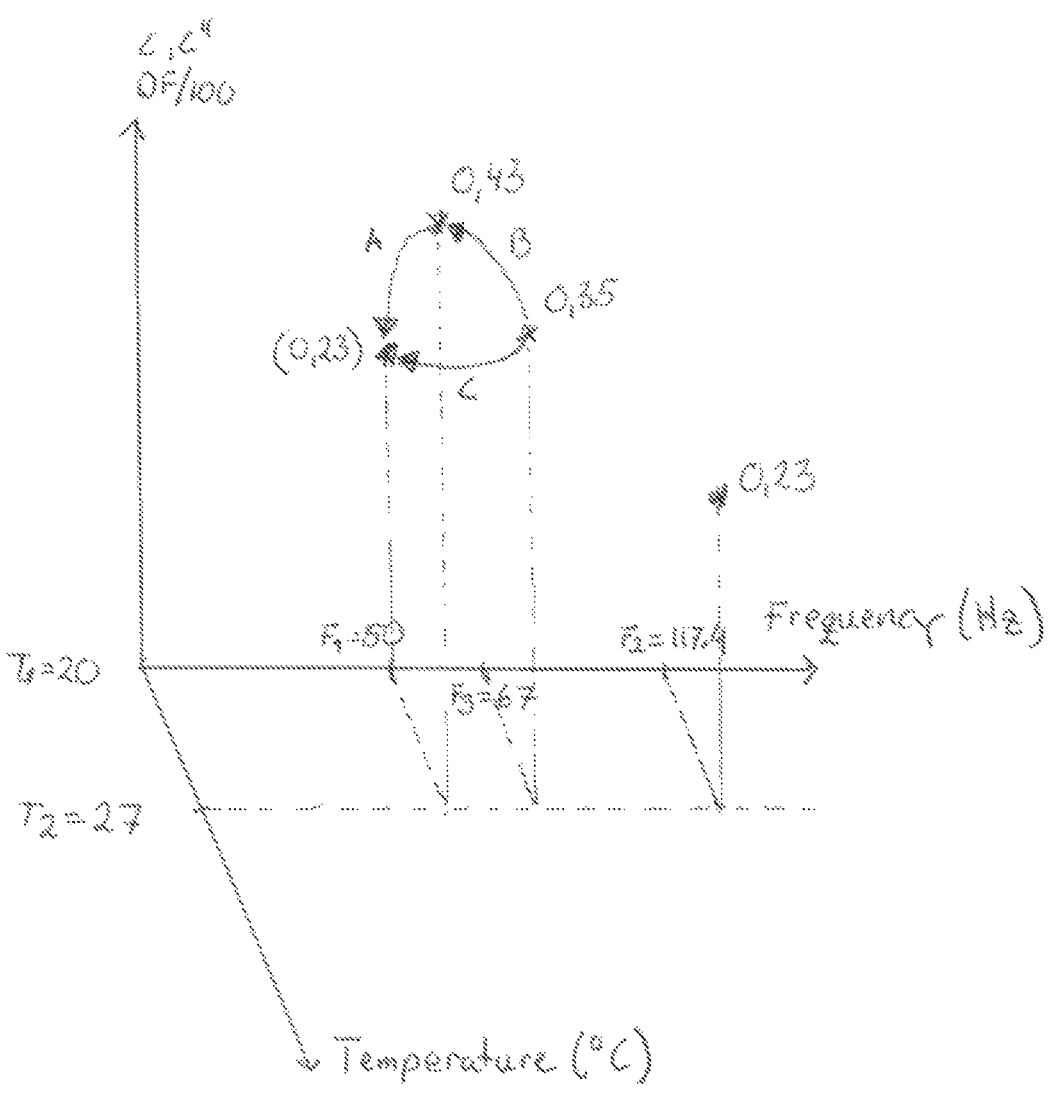
FIG. 3 is a diagram showing an example of frequency correction (A), temperature correction (B) and the combined correction (C)

An example will now be described with reference to FIG. 3, wherein the frequency correction (A), the temperature correction (B) and the combined correction (C) have been implemented for losses expressed as Dissipation Factor/100 (DF/100). The method is the same for other dielectric parameters such as but not limited to capacitance, tan delta, insulation power factor and complex capacitance, C' and C"

In case of only apply frequency correction (B), the correction factor is $$DF\_corr\_F = DF\_r/DF\_m = 0.43/0.35 = 1.23$$

In case of only apply temperature correction (A), the correction factor is $$DF\_corr\_T = DF\_e/DF\_m = 0.23/0.43 = 0.53$$

In case of combined correction (C), the correction factor is $$DF\_corr\_C = DF\_e/DF\_m = 0.23/0.35 = 0.66$$

Preferred embodiments of a method and a device according to the invention have been described. It will be appreciated by one skilled in the art that the inventive idea can been implemented in other ways than described above. For example, in the embodiment described with reference to FIGS. 3, the temperature correction has been implemented for both capacitance and for losses. Alternatively, the temperature correction can be implemented for only one of these.

A fixed inductor 30 has been described, but it will be realized that also a variable inductor can be used with the described method. Also, more than one inductor may be used.

The invention claimed is:

1. A method of measuring a characteristic of an electrical insulation system of a high voltage device connectable to an electrical network, the method comprising the following steps:

a) disconnecting the high voltage device from the electrical network and connecting a measuring equipment to the electrical insulation system, thereby providing a test system, b) connecting an inductor to the test system, c) determining a reference frequency, d) determining a measuring frequency of the measuring operation, wherein the step of determining the measuring frequency comprises the following steps:

determining the capacitance of the test system, determining possible inductances connectable to the test system, based on the capacitance of the test system and possible inductances, determining the measuring frequency at or close to resonance, e) measuring at least one of capacitance and loss at the measuring frequency (C_m, Loss_m) and at the reference frequency (C_r, Loss_r), f) providing at least one correction factor (C_corr_F, Loss_corr_F) according to the following formulas:

$$C\_corr\_F = C\_r/C\_m$$

-continued $$Loss\_corr\_F = Loss\_r/Loss\_m$$

g) and applying at least one correction factor on measurement results at the measuring frequency to obtain corrected measurements results corresponding to the reference frequency.

2. The method according to claim 1, wherein the high voltage device is any of the following: electric transformer, including power transformers, instrument transformer, cable, bushing, generator, and other rotating machine, and circuit breaker.

3. The method according to claim 1, wherein the reference frequency is any of the following: 0.1 Hz, 1 Hz, 16.67 Hz, 25 Hz, 50 Hz and 60 Hz.

4. The method according to claim 1, wherein the characteristic is any of the following: capacitance and loss.

5. The method according to claim 4, wherein the characteristic is capacitance, and the capacitance of the insulation system is preferably above 50 nF, more preferably above 80 nF and most preferably above 100 nF.

6. The method according to claim 1, comprising step a) comprises connecting the inductor in parallel with the high voltage device.

7. The method according to claim 1, comprising step a) comprises connecting the inductor in series with the high voltage device.

8. The method according to claim 1, wherein the reference temperature is selected to be 20° C.

9. The method according to claim 1, comprising the additional step of replacing or attending to at least part of the electrical insulation system if the measured characteristic indicates that the electrical insulation system is faulty.

10. The method according to claim 1, wherein, at equivalent frequency and/or reference frequency, the applied voltage level is lowered a factor of least 5, preferably of at least 10, compared to voltage level used at measurement frequency.

11. A device for measuring a characteristic of an electrical insulation system of a high voltage device connectable to an electrical network, the device comprising a test equipment provided with processing means adapted to perform the method according to claim 1.

12. A method of measuring a characteristic of an electrical insulation system of a high voltage device connectable to an electrical network, the method comprising the following steps:

a) disconnecting the high voltage device from the electrical network and connecting a measuring equipment to the electrical insulation system, thereby providing a test system, b) connecting an inductor to the test system, c) determining a reference frequency, d) determining an insulation temperature of the electrical insulation system, e) determining an equivalent frequency based on the insulation temperature, a reference temperature, a reference frequency, and the activation energy of the electrical insulation system, f) determining a measuring frequency of the measuring operation, wherein the step of determining the measuring frequency comprises the following steps:
   determining the capacitance of the test system,
   determining possible inductances connectable to the test system, g) based on the capacitance of the test system and possible inductances, determining the measuring frequency at or close to resonance, measuring at least one of capacitance and loss at the measuring frequency (C_m, Loss_m) and at the equivalent frequency (C_e, Loss_e), h) providing at least one correction factor (C_corr_C, Loss_corr_C) according to the following formulas:

$$C\_corr\_C = C\_e/C\_m$$

$$Loss\_corr\_C = Loss\_e/Loss\_m$$

i) and applying at least one correction factor on measurement results at the measuring frequency to obtain corrected measurements results corresponding to the reference frequency and at the reference temperature.

* * * * *